United States Patent
Pogrebnoy

(10) Patent No.: US 6,424,181 B1
(45) Date of Patent: Jul. 23, 2002

(54) HIGH-SPEED LOW-POWER SENSE AMPLIFYING HALF-LATCH AND APPARATUS THEREOF FOR SMALL-SWING DIFFERENTIAL LOGIC (SSDL)

(75) Inventor: Yuri L. Pogrebnoy, Moscow (RU)

(73) Assignee: Elbrus International Limited, George Town (KY)

( * ) Notice: Subject to any disclaimer, the term of this patent is extended or adjusted under 35 U.S.C. 154(b) by 0 days.

(21) Appl. No.: 09/505,658

(22) Filed: Feb. 17, 2000

Related U.S. Application Data
(60) Provisional application No. 60/120,343, filed on Feb. 17, 1999.

(51) Int. Cl.[7] .............................. G11C 7/06; G11C 11/56
(52) U.S. Cl. .............................. 327/55; 327/57; 327/51; 365/168; 365/205; 365/207; 326/95
(58) Field of Search .............................. 326/93, 95, 98; 327/51–57; 365/205, 207, 208

(56) References Cited

U.S. PATENT DOCUMENTS

| | | | | |
|---|---|---|---|---|
| 5,812,474 A | * | 9/1998 | Liu et al. | 365/207 |
| 5,854,562 A | * | 12/1998 | Toyoshima et al. | 327/55 |
| 6,005,799 A | * | 12/1999 | Rao | 365/168 |
| 6,078,523 A | * | 6/2000 | Pascucci | 365/185.21 |
| 6,147,514 A | * | 11/2000 | Shiratake | 327/55 |
| 6,184,722 B1 | * | 2/2001 | Hayakawa | 327/55 |

OTHER PUBLICATIONS

M. Matsui and J. B. Burr, "*A Low–Voltage 32 x 32–Bit Multiplier in Dynamic Differential Logic,*" 1995 IEEE Symposium on Low Power Electronics, pp. 34–35.

M. Matsui, et al. "*200MHz Video Compression Macrocells Using Low–Swing Differential Logic,*" 1994 IEEE International Solid–State Circuits Conference, pp. 76–77 and 314.

* cited by examiner

Primary Examiner—Michael Tokar
Assistant Examiner—Vibol Tan
(74) Attorney, Agent, or Firm—Townsend and Townsend and Crew

(57) ABSTRACT

A high-speed sense amplifier includes a pair of cross-coupled inverters coupled to intermediate nodes and then to differential inputs nodes by a control circuit. The intermediate nodes are coupled together by a accelerator transistor that forms a current path when the sense amplifier is placed in a sensing state to provide parallel discharge paths for one or the other of output nodes. During precharge, the accelerator transistor operates to equalize the intermediate nodes to ready them for the next sense phase.

24 Claims, 5 Drawing Sheets

US 6,424,181 B1

HIGH-SPEED LOW-POWER SENSE AMPLIFYING HALF-LATCH AND APPARATUS THEREOF FOR SMALL-SWING DIFFERENTIAL LOGIC (SSDL)

CROSS-REFERENCES TO RELATED APPLICATIONS

This invention claims priority from co-pending U.S. Provisional Patent Application No. 60/120,343 filed Feb. 17, 1999, the disclosure of which is incorporated herein in its entirety for all purposes.

BACKGROUND OF THE INVENTION

1. Field of the Invention

The present invention relates to a sense amplifier, and, more particularly, to a clocked differential CMOS sense amplifier intended for sensing and latching of small-swing differential signals.

2. Description of the Prior Art

There is a wide range of clocked differential sense amplifiers designs available today for sensing small differential signals. Most, however, if not all, use a cross-coupled transistor structure that serves as the basis of the sense amplifier function. The principal differences between these various sense amplifier designs relates to the method of imbalancing in the cross-coupled nodes before or during the strobe pulse edge. An example of present day sense amplifiers for small differential signals can be found in M. Matsui and J. B. Burr "A Low-Voltage 32 * 32-Bit Multiplier in Dynamic Differential Logic" 1995 IEEE Symposium on Low Power Electronics, Vol. 1.

A typical prior art sense amplifier circuit 10 used in small signal differential logic (SSDL) is shown in FIG. 1. The timing diagram illustrating operation of the circuit of FIG. 1(a) is shown in FIG. 1B. (In FIG. 1B inputs I and NI and outputs Q and NQ are shown together. The solid lines 12 and 16 are the voltage levels for input I and output Q, respectively, while the dotted lines 14 and 18 are the voltage levels for input NI and output NQ, respectively.)

As FIG. 1A shows, complementary CMOS transistors MP1/MN1 and MP2/MN2 form a pair of cross-coupled inverters as is conventional in such sensing circuits. Transistor MP5, controlled by clock pulse (NCLK), serves as a clocked current source, and transistors MN3, MN4 operate to precharge the cross-coupled output nodes Q and NQ to ground when the current source MN5 is turned off and transistors MN3 and MN4 are turned on by the high level of the NCLK signal. The Transistors MP3, MP4 provide the difference in discharging currents in accordance with any imbalance in the input voltages applied to the input nodes I, NI. The sense phase of the circuit 10 is entered when NCLK goes low to turn on the current source transistor MP5. Inputs I and NI receive the differential signal to be sensed, and the small difference in voltage levels at inputs I and NI will create a difference in discharging currents which, in turn, will cause one of the cross-coupled inverters MP1/MN1, MP2/MN2 to conduct faster than the other, leading to a difference in voltages of output nodes Q and NQ. Because of the positive feedback provided by the cross-coupling between the inverters MP1/MN1 and MP2/MN2, the output node with the higher potential will be pulled even higher, and the other will be pulled back to ground.

While prior art sense amplifiers similar to that shown in FIG. 1A perform their functions well, their dependence on the conductivity of the charging or discharging paths and the capacitance of the cross-coupled nodes can adversely affect speed and loading characteristics. Circuits of the type of FIG. 1A often have a charge/discharge path that includes three p-channel transistors. For example, the charge/discharge paths of the sense amplifier 10 include transistors MP1, MP3, and MP5 (or MP2, MP4, and MP5) connected in series. This use of p-channel transistors in a current path can tend to limit conductivity.

In addition, the capacitance of each of the cross-coupled nodes include (1) the drain capacitance of the one p- and n-channel cross-coupled transistor pair and (2) the gate capacitance of the opposite pair and the drain capacitance of recovery transistor MN3 (MN4). In order to ensure to establish sharp rising edges of the output signals at outputs Q and NQ, the p-channel transistors MP1 and MP2 must be relatively large. This, however, requires the p-channel transistors to be made larger, using expensive semiconductor real estate.

SUMMARY OF THE INVENTION

The present invention provides a CMOS clocked sense amplifier that provides high speed sensing of low-swing complementary signals. Broadly, the sense amplifier of the present invention includes a controlled latch for sensing and amplifying the differential input, a control circuit, and recovery circuit. The latch includes a pair of cross-coupled CMOS inverters each having individual controlled current paths to ground provided by the control circuit. The control circuit includes sense inputs to receive the differential signal and a clock input to receive the clock signal that functions as a sense strobe, alternately switching the amplifier between a sense state and a pre-charge state. An acceleration transistor couples the sense inputs to one another to discharge and equalize the inputs when the clock signal is in a pre-charge state. The sense amplifier is structured so that only two n-channel transistors form a discharge path for the inputs, to provide a high-speed output of the sense amplifier.

BRIEF DESCRIPTION OF THE DRAWINGS

FIG. 4B illustrates a block diagram of 3-2 adder as a building block of single-clock pipelined multiplier, using basic element FIG. 4a;

DESCRIPTION OF THE SPECIFIC EMBODIMENTS

Figure 1A:
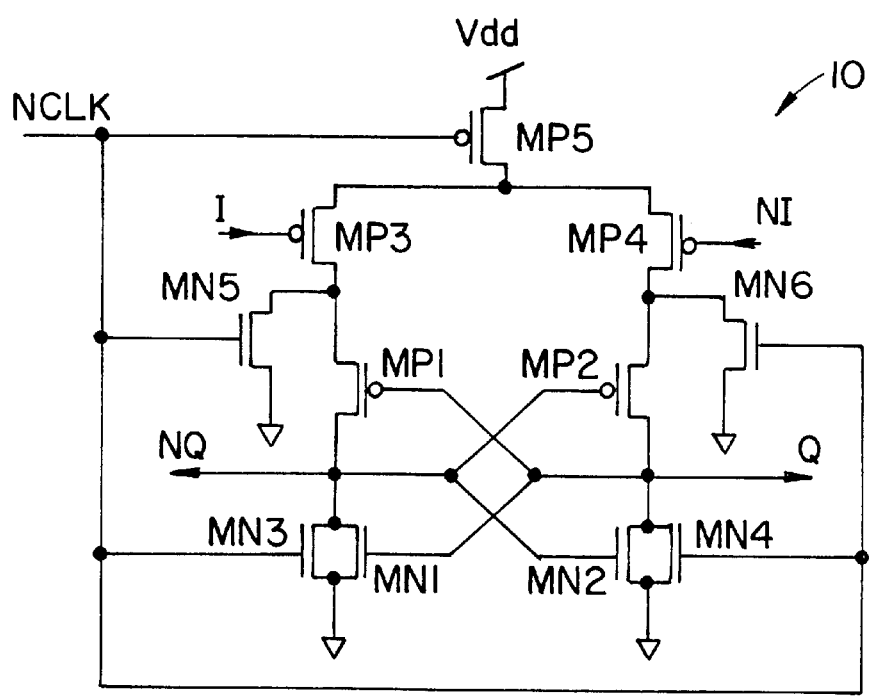
FIG. 1A illustrates a circuit diagram of a prior art sense amplifier.
Figure 1B:
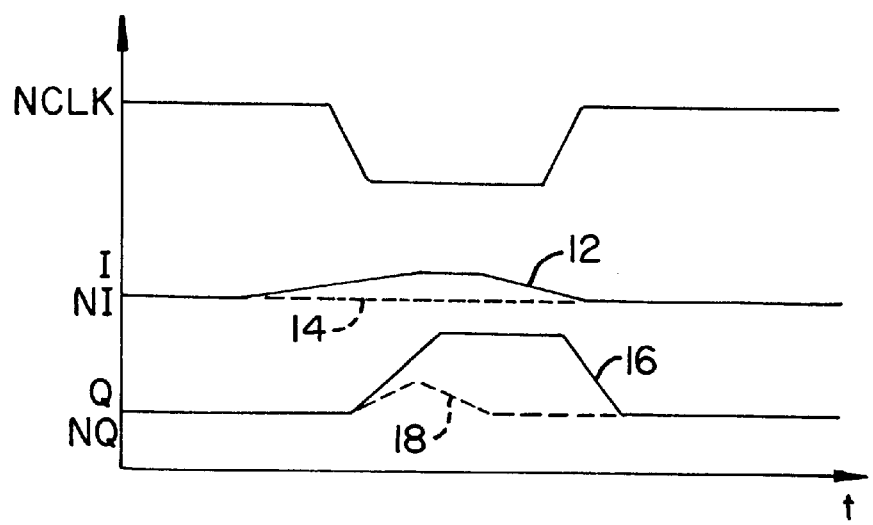
FIG. 1B illustrates a simplified timing diagram for the prior art sense amplifier of FIG. 1A.
Figure 2A:
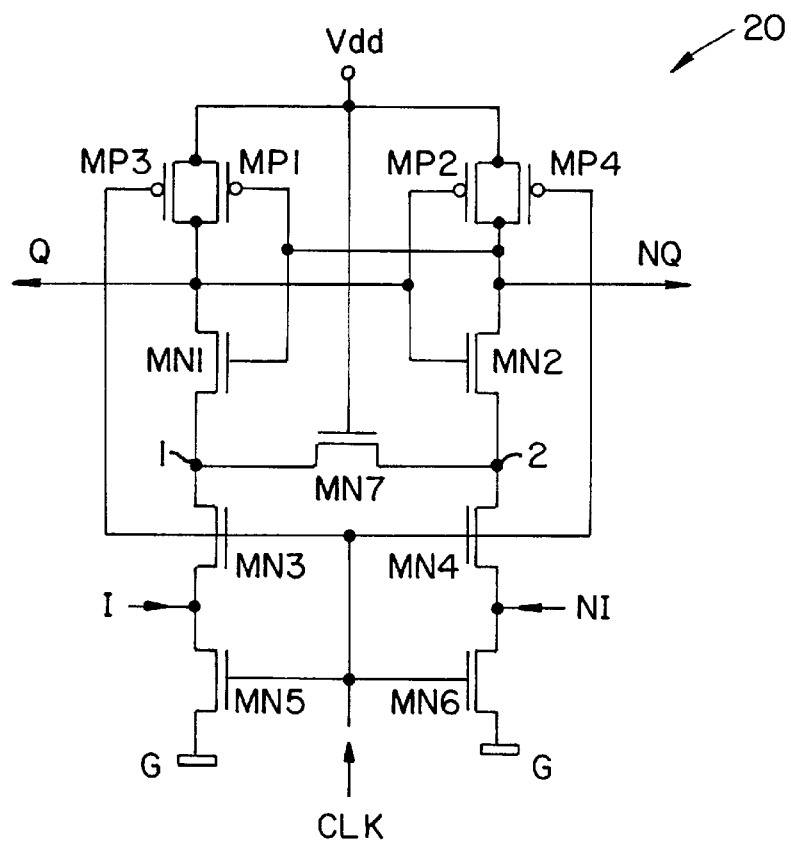
FIG. 2A illustrates a circuit diagram of the sense amplifier according to present invention.
Figure 2B:
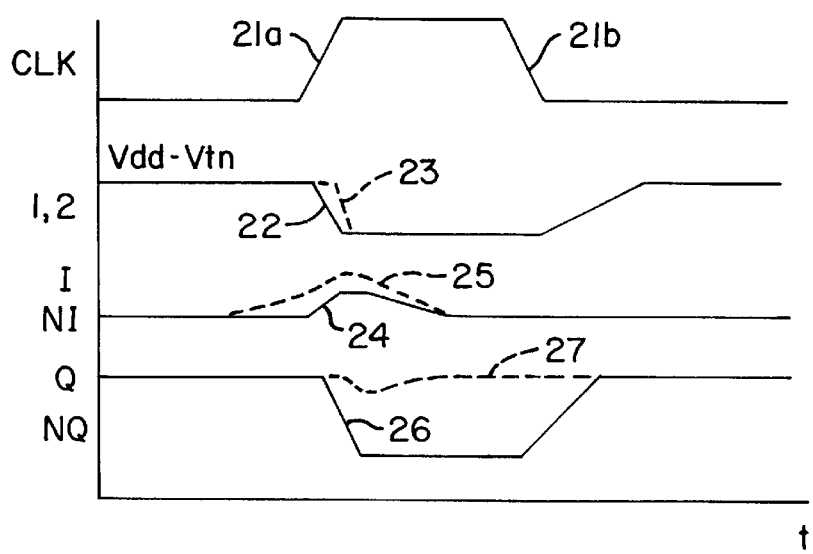
FIG. 2B illustrates a simplified timing diagram of the sense amplifier according to present invention.

Referring to FIG. 2A a CMOS sense amplifier 20 according to the present invention is shown. A timing diagram, illustrating operation of the sense amplifier 20, is shown in FIG. 2B. As FIG. 2A shows, the sense amplifier 20 includes a cross-coupled pair of inverters (transistors MP1/MP2 and MN1/MN2), a control circuit, including transistor pairs MN3/MN5 and MN4/MN6 that couple nodes 1 and 2 to inputs I and NI and to a ground potential G, a recovery circuit (transistors MP3, MP4) and an acceleration transistor MN7 coupled between nodes 1 and 2 and with a gate lead coupled to the supply voltage, Vdd.

FIG. 2B is a timing diagram for the sense amplifier 20. In FIG. 2B, the dotted lines 23, 25, and 27 represent the potentials at node 1, input I and output Q, respectively.

Sense amplifier FIG. 2A operates in three states: the precharge state, the sensing or latching state and the recovery state. When the CLK signal is low, the on transistors MP3 and MP4 are on, the transistors MN3/MN5 and MN4/MN6 are off, charging the output nodes Q, NQ close to Vdd. This will turn on the transistors MN1 and MN2 to charge nodes 1 and 2 close to Vdd−Vtn, where Vtn is the threshold voltage of the n-channel transistor MN1 (or MN2). With the nodes 1 and 2 at Vdd−Vtn, the transistor MN7 will be off.

The latching state is initiated by rising edge of CLK pulse. Assume that the differential potentials at the inputs I and NI are Vih and Vil, respectively, with Vih>Vil. When the rising edge 21a (FIG. 2A) of the CLK signal, which initiates the sense/latch state, reaches Vtn+Vil, transistor MN4 will start to conduct to begin discharging node 2 and in sequence, output node NQ. As node 2 drops, transistor MN2 will begin conducting harder to drop the input node NQ lower. This, in turn, will begin to turn off the transistor MN1 while at the same time turning on the transistor MP1. When the rising edge of the CLK signal reaches Vtn+Vih, transistor MN3 will start to discharge node 1, and in sequence node NQ. The sensing/latching operation is now fully under way.

Initially in this sensing process the voltage across transistor MN7 is small so that its conductivity will remain small. However, the transistor MN7 will start to conduct when the difference between its gate and source (or drain) overcomes Vtn, and serves to assist in the discharge process by providing a parallel discharge path for the input node NQ. Thus, there are two discharge paths provided the input node NQ: one established by the transistors MN2, MN4, and MN6, and the second established by transistors MN2, MN7, MN3, and MN5.

The recovery or precharge process begins with the falling edge 21b to turn off transistors MN3/MN5 and MN4/MN6 while turning on transistors MP3 and MP4 to charge the output nodes Q and NQ to Vdd. At the same time the transistor MN7 will be conductive to equalize the nodes 1 and 2, shutting off when they are equalized.

Thus, it should now be evident that the accelerator transistor MN7 functions to provide an additional discharge path during the initial phase of the sensing operation, and to later equalize the nodes 1 and 2 during the precharge state.

Falling edge of CLK pulse initiates the recovery state. Transistors MN3, MN4 are turned off and cut off current paths from output nodes Q, NQ to ground, transistors MP3, MP4 are turned on and pull up nodes Q, NQ to Vdd, and, in consequence, nodes 1 and 2 to Vdd−Vtn.

Figure 3A:
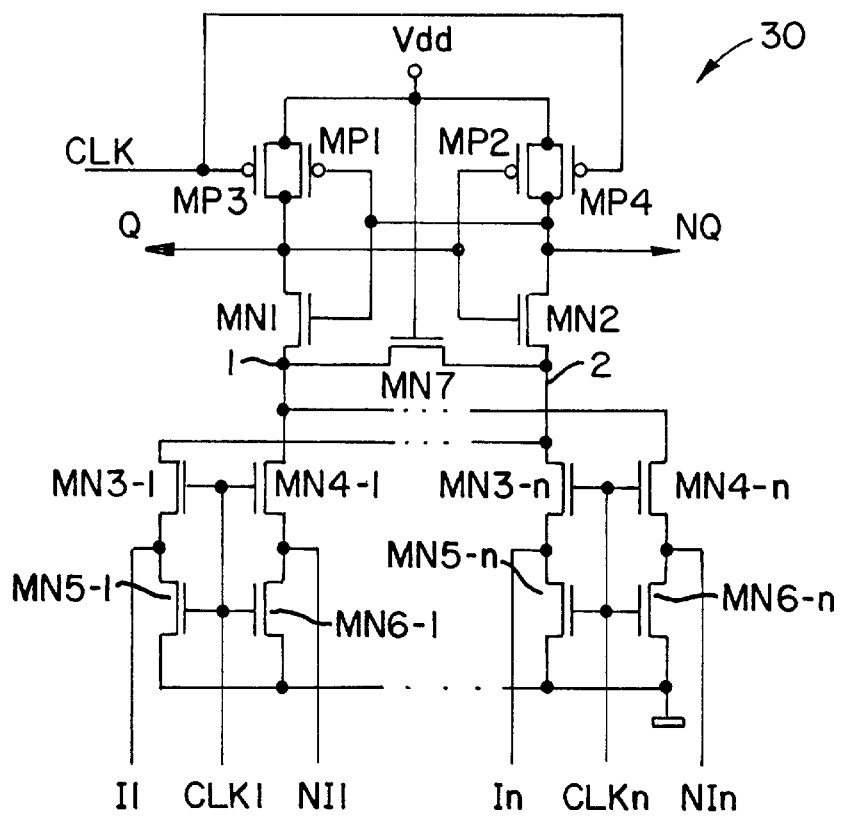
FIG. 3A illustrates a circuit diagram of multi-input sense amplifier according to present invention.
Figure 3B:
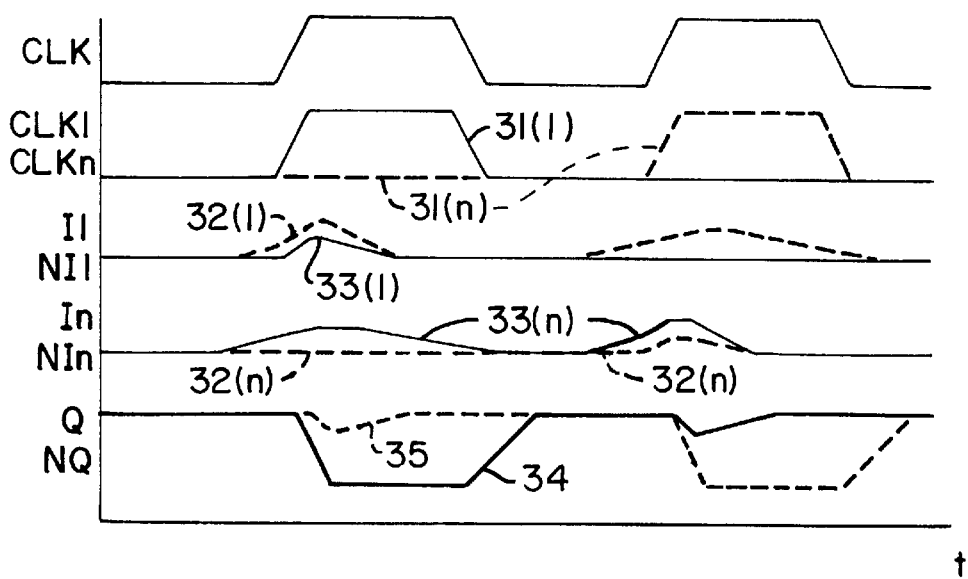
FIG. 3B illustrates a simplified timing diagram of multi-input sense amplifier according to present invention.

Referring to FIG. 3A a sense amplifier incorporating the present invention and having N differential inputs (N=2,3 . . . ) is shown. The timing diagram illustrating operation of the sense amplifier is shown. (In FIG. 3B the dotted lines 31(n), 32(1), and 32(n) represent the signals applied to the CLKn, I1 inputs and at the NQ output, respectively. The solid lines represent the signals applied to the CLK1, NI1, and N1n inputs and at the Q output, respectively. Note that the sense amplifier uses alternate clock signals, CLK1, . . . , CLKn, to alternately sense the differential signals I1/NI1 and In/NIn, respectively.

Figure 4A:
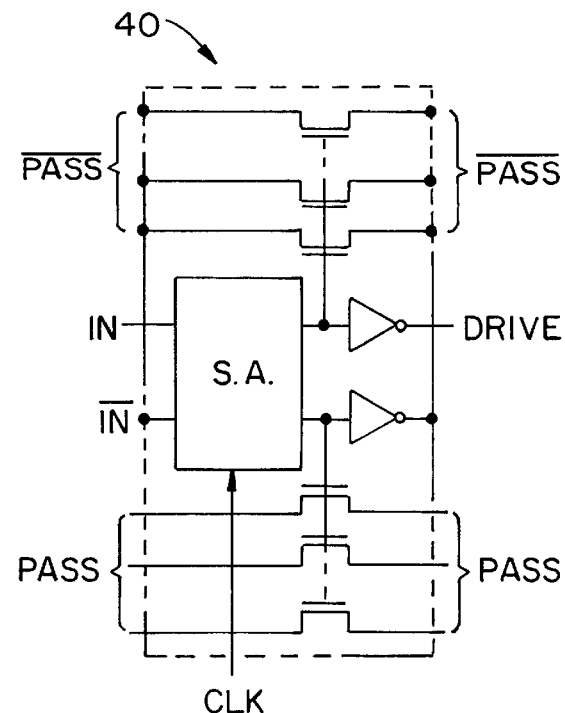
FIG. 4A illustrates a block diagram of a basic element for SSDL using sense amplifier FIG. 2a according to present invention.

FIGS. 4A–4D show illustrate some basic elements incorporating at least one sense amplifier constructed according to the teachings of the present invention. FIG. 4A illustrates an SDDL device 40 having N pairs of pass-transistors (N=0,1,2 . . . ) with gates of each pair connected to nodes Q, NQ of sense amplifier(s), M pairs of inverters or static CMOS logic gates (M=0,1,2 . . . ) with their inputs connected to nodes Q, NQ of sense amplifier(s).

Figure 4B:
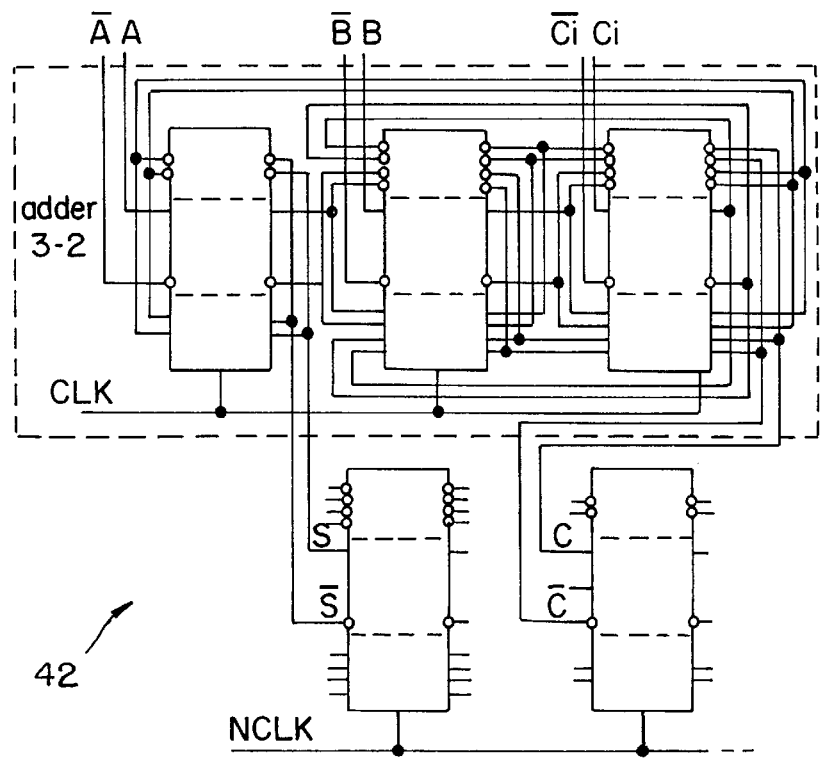
Figure 4C:
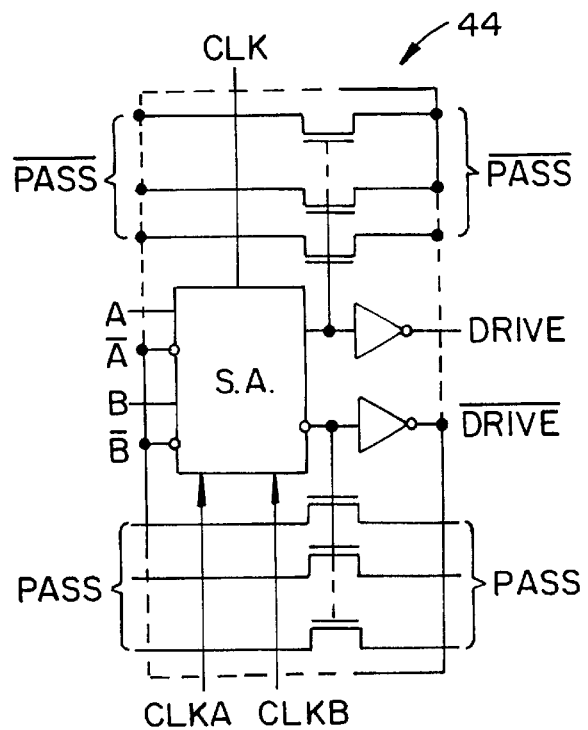
FIG. 4C illustrates a block diagram of two-input basic element for SSDL sing sense amplifier FIG. 3A according to present invention.
Figure 4D:
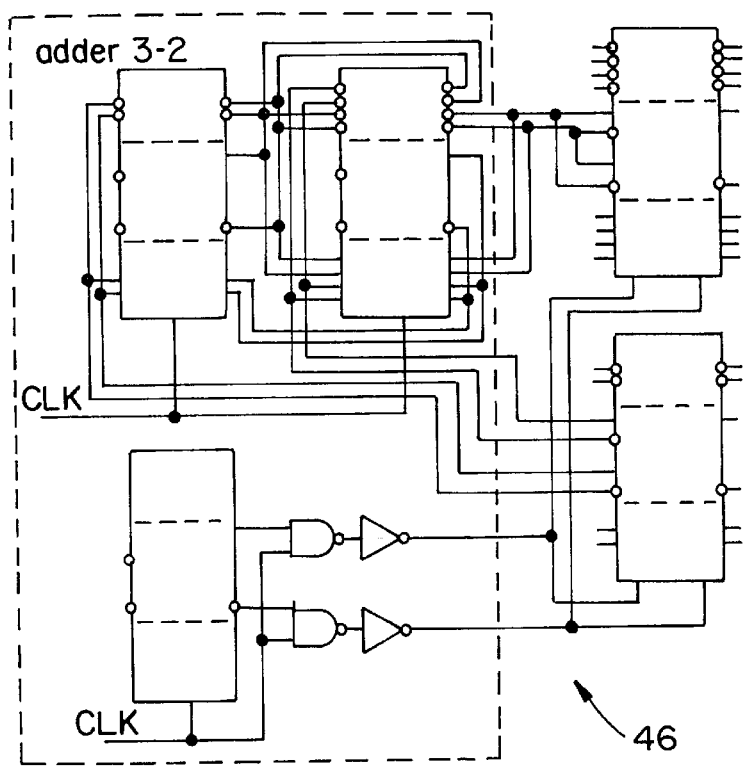
FIG. 4D illustrates a block diagram of a 3-2 adder as a building block of wave-clock pipelined multiplier, using basic element FIG. 4C.

FIG. 4B illustrates a full adder 42 as a building block for single-clock pipelined multiplier. FIG. 4C is a block diagram of a two-input element using a multi-input sense amplifier such as that shown in FIG. 3A.

What is claimed is:

1. A dynamic sense amplifier for amplifying a pair of signals comprising a small-swing differential signal, the sense amplifier comprising:

(a) a pair of CMOS inverters cross-coupled to one another to form a latch, each of the pair CMOS inverters being coupled to a supply voltage;

(b) a pair of intermediate nodes, each of the pair of CMOS inverters being coupled to form a serial path between the supply voltage and a corresponding one of the intermediate nodes;

(c) a pair of inputs for receiving corresponding ones of the input signals;

(d) a control circuit connected to couple the intermediate nodes to corresponding ones of the pair of inputs, and coupling the pair of inputs to a ground connection;

(e) an acceleration transistor connected to form a current path between the pair of intermediate nodes to supply voltage for acceleration of discharging and equalization processes in response to a clock signal, wherein a gate of the acceleration transistor is directly coupled to the supply voltage.

2. A dynamic sense amplifier for amplifying a pair of signals comprising a small-swing differential signal, the sense amplifier comprising:

(a) a pair of CMOS inverters cross-coupled to one another to form a latch;

(b) a pair of intermediate nodes, each of the pair of CMOS inverters being coupled to a supply voltage to form a serial path between the supply voltage and a corresponding one of the intermediate nodes;

(c) a pair of inputs for receiving corresponding ones of the input signals;

(d) a control circuit connected to couple the intermediate nodes to corresponding ones of the pair of inputs, and coupling the pair of inputs to a ground connection;

(e) an acceleration transistor connected to form a current path between the pair of intermediate nodes to supply voltage for acceleration of discharging and equalization processes in response to a clock signal, wherein a gate of the acceleration transistor is directly coupled to the supply voltage.

3. The sense amplifier of claim 1, wherein the control circuit includes first and second pairs of series connected transistors coupling corresponding ones of the intermediate nodes to a potential.

4. The sense amplifier of claim 3, wherein a one of the pair of inputs conmects to and between a one of the pair of series connected transistors and the other of the pair of inputs connects to and between the other of the pair of series connected transistors.

5. A multi-input sense amplifier for receiving and sensing N input signals and a complement of each of the N input signals, where N is an integer, the sense amplifier comprising:
   a latch coupled between a supply voltage and a pair of nodes, the latch including two cross-coupled CMOS inverters and true and complement outputs;
   N control circuits coupling the pair of nodes to a predetermined potential, each of the N control circuits having differential inputs to receive a corresponding one of the N input signals and the complement of the one N input signal and a sensing strobe input coupled to receive a corresponding strobe signal for selecting a one of the N control circuits for sensing, the N control circuits operating to form a current path between the plurality of nodes and the predetermined potential in response to selection by the strobe signal to cause the latch to sample the one input signal and the complement of the one input signal;
   an acceleration transistor coupled between the pair of nodes to accelerate discharge of the latch.

6. The sense amplifier of claim 5, each of the N control circuits including first and second series-connected NMOS transistor pairs respectively coupled to receive the corresponding ones of the N input signals and the complement of such ones of the N input signals, the NMOS transistor pairs further coupled to respond to the strobe signal to form the current path.

7. The sense amplifier of claim 6, wherein the first series-connected NMOS transistor pairs of each of the N control circuits couples a one of the pair of nodes to the predetermined potential.

8. The sense amplifier of claim 7, wherein the second series-connected NMOS transistor pairs couples another one of the pair of nodes to the predetermined voltage.

9. The sense amplifier of claim 8, wherein the supply voltage is greater than the predetermined potential.

10. The sense amplifier of claim 9, wherein the supply voltage is positive.

11. The sense amplifier of claim 9, wherein the predetermined voltage is a ground potential.

12. The sense amplifier of claim 11, wherein the supply voltage is positive.

13. The sense amplifier of claim 5, the latch including a precharge circuit coupled to receive a clock signal operating to precharge the true and complement outputs of the latch to a predetermined voltage.

14. The sense amplifier of claim 13, wherein the precharge circuit includes a pair of PMOS transistors each coupled in parallel with corresponding ones of the two cross-coupled CMOS inverters.

15. The sense amplifier of claim 8, the acceleration transistor including a gate lead coupled to the supply voltage.

16. The sense amplifier of claim 15, wherein the acceleration transistor is an MOS transistor having a drain lead coupled to the one of the pair of nodes and a source lead coupled to the other of the pair of nodes.

17. The sense amplifier of claim 16, wherein the acceleration transistor is a NMOS transistor.

18. A sense amplifier for receiving and sensing N input signals, where N is an integer, each of the N input signals including a true signal and a complement of the true signal, the sense amplifier comprising:
   a pair of cross-coupled CMOS inverters forming a sense latch coupled between a supply voltage and a pair of nodes, the sense latch having true and complement output terminals;
   N control circuits each including a first pair of series-connected NMOS transistors coupled between a one of the pair of nodes to a ground potential and a second pair of series-connected NMOS transistors coupled between the other of the pair of nodes to the ground potential, differential inputs connected to receive corresponding ones of the N input signals, and a strobe input coupled to receive a corresponding one of N sense strobe signals, each of the N control circuits operating to form a current path between the pair of nodes and the ground potential in response to the corresponding N sense strobe signals to cause the sense latch to sample the N input signals for output at the true and complement output terminals; and
   an acceleration circuit including an MOS transistor having a gate lead coupled to the supply voltage and source and drain leads respectively coupled the one and the other of the pair of nodes.

19. The sense amplifier of claim 18, wherein the MOS transistor is an NMOS transistor.

20. The sense amplifier of claim 18, wherein the supply voltage is positive.

21. A sense amplifier for sensing and amplifying a true signal and a complement of the true signal, the sense amplifier comprising:
   a pair of cross-coupled CMOS inverters forming a sense latch coupled between a supply voltage and a pair of nodes, the sense latch having true and complement output terminals;
   a control circuit comprising a first pair of series-connected NMOS transistors coupled between the a one of the pair of nodes to a ground potential and a second pair of series-connected NMOS transistors coupled between the other of the pair of nodes to the ground potential, the control circuit including differential inputs connected to receive the true and complement input signals, and a strobe input coupled to receive a strobe signal, the control circuit operating to form a current path between the pair of nodes and the ground potential in response to the strobe signal to cause the sense latch to sense and amplify the true and complement input signals for output at the true and complement output terminals; and
   an acceleration circuit including an MOS transistor having a gate lead coupled to the supply voltage and source and drain leads respectively coupled the one and the other of the pair of nodes.

22. The sense amplifier of claim 21, wherein the MOS transistor is an NMOS transistor having source and drain leads respectively coupled to the one and the other of the pair of nodes.

23. The sense amplifier of claim 22, wherein each of the CMOS inverters includes first and second PMOS transistors connected in parallel configuration, the first PMOS transistor of each of the CMOS inverters having a gate lead coupled to a clock signal; the CMOS inverters operating to precharge the true and complement output terminals to a predetermined voltage in response to the clock signal.

24. The sense amplifier of claim 23, wherein the sense strobe and the clock signal are the same signal.

* * * * *